US005086871A

United States Patent [19]

Barbe

[11] Patent Number: 5,086,871

[45] Date of Patent: Feb. 11, 1992

[54] OMNIDIRECTIONAL ELECTRO-ACCOUSTICAL CHAMBER

[76] Inventor: Alain Barbe, 17, rue Faidherbe, 33110 Le Bouscat, France

[21] Appl. No.: 414,924

[22] Filed: Sep. 29, 1989

[30] Foreign Application Priority Data

Sep. 29, 1988 [FR] France ................................ 88 12930

[51] Int. Cl.5 ................................................ H05K 5/00

[52] U.S. Cl. .................................... 181/145; 181/155; 381/160

[58] Field of Search ............... 181/144, 145, 154, 155, 181/199; 381/158, 160

[56] References Cited

U.S. PATENT DOCUMENTS 3,816,672 6/1974 Gefvert et al. ....................... 381/158
4,200,170 4/1980 Williams, Jr. ................... 181/144 X
4,322,578 3/1982 Selmin ............................ 181/199 X
4,588,042 5/1986 Palet et al. .......................... 181/153

FOREIGN PATENT DOCUMENTS 894728 2/1983 Belgium .
69645 3/1974 Luxembourg .

*Primary Examiner*—Brian W. Brown
*Attorney, Agent, or Firm*—Harrison & Egbert

[57] ABSTRACT

Omnidirectional electro-acoustical chamber comprising two transducers (4) for low/medium tones and (7) for shrill tones disposed coaxially with their membranes facing one another, the transducer (4) being maintained at the end of the extensions (2) of a compartment (1) and the transducer (7) at the end of the compartment (5), a portion of the sounds emitted by the transducers (4, 7) being diffused by means of a diffuser (9) placed between the membranes, the other portion being reflected on the surfaces (12, 13) of the compartments (1, 5).

4 Claims, 2 Drawing Sheets

OMNIDIRECTIONAL ELECTRO-ACCOUSTICAL CHAMBER

The present invention concerns omnidirectional electro-acoustical chambers.

Omnidirectional electro-acoustical chambers are known, such as those described in French Certificate of Utility No. 2 242 830 comprising shrill, medium and low tone transducers integrated with circular plates and disposed coaxially, the transducers of shrill and medium tones being oriented with their membranes facing one another, the said membranes being separated by a transverse circular partition forming with the retaining plates two channels having an open periphery each intended to diffuse the sound produced by the corresponding transducer in an omnidirectional manner, thanks to a diffuser disposed on each surface of the passage having a convex revolution shape aligned with the axis of the transducers. The sound produced by the transducers thus diffused is of mediocre quality considering the mode of diffusion provoking uncontrolled reflections on the plates and the separation partition.

The invention has as an object to overcome the above-described disadvantage.

The invention has as an object an omnidirectional electro-acoustical chamber comprising two transducers for low/medium tones and shrill tones disposed in a coaxial manner with their membranes facing one another maintained on two compartments, the said chambers characterized in that the transducers are maintained one on the end of the extension of its compartment and the other on the end of the compartment in the shape of a truncated regular pyramid or cone, producing reflective surfaces permitting each to diffuse in a horizontal manner a portion of the sounds emitted by the opposed transducer, the other part of the said sounds being dispersed in a horizontal manner by means of a single deflector of convex revolution shape disposed in alignment with and between the transducers.

Figure 1:
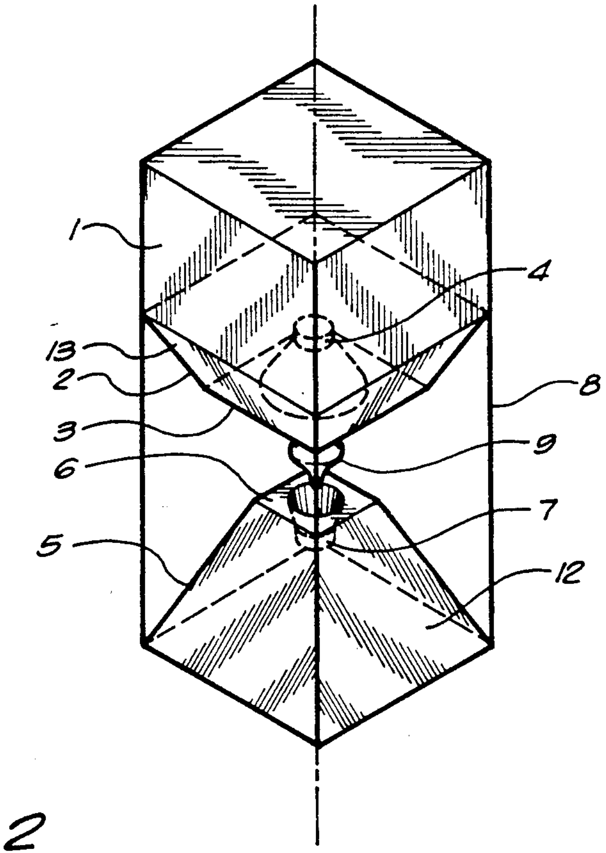
Figure 2:
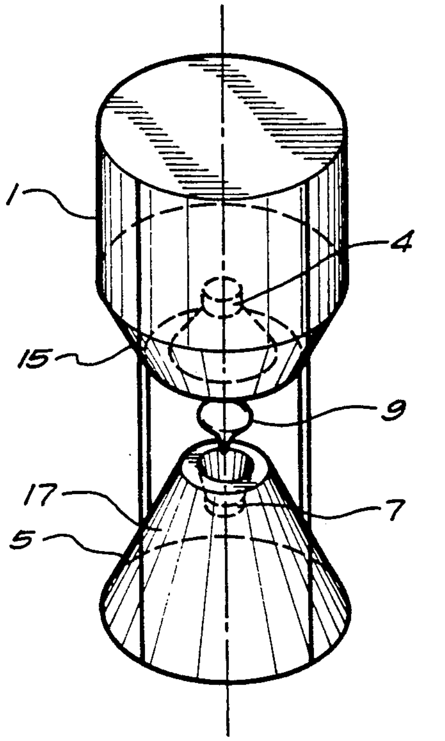
Figure 3:
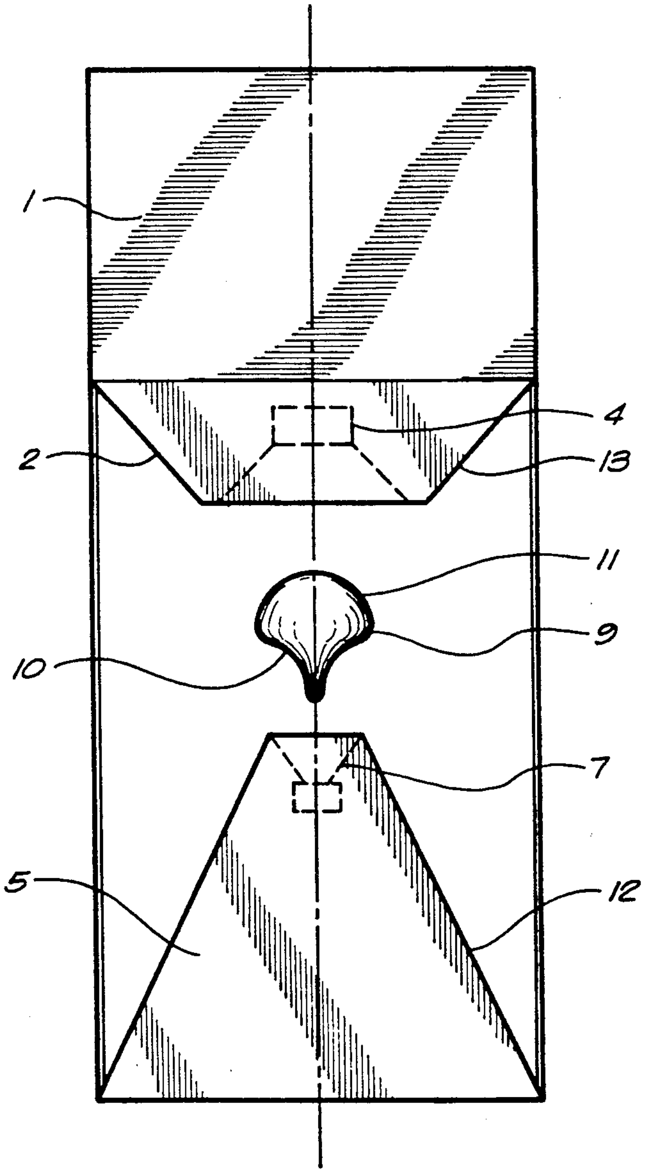

Other characteristics and advantages of the invention will be more clearly evident from the description which follows, taken with respect to the accompanying drawings given by way of non-limiting example, where:

FIG. 1 is a perspective view of a chamber having reflecting surfaces in the form of a truncated regular pyramid, FIG. 2 is a variation of a chamber having reflecting surfaces in the form of a truncated regular cone, FIG. 3 is a front view of the chambers shown in FIGS. 1 and 2.

As shown in FIGS. 1 and 3, a chamber according to the invention comprises an upper compartment 1 of parallelepipedal shape, whose surfaces in its lower portion are extended by a truncated regular pyramid 2 in the center of the end 3 of which is maintained the transducer 4 for low and medium tones, the compartment 1 and its extension 2 constituting the tuning chamber of the transducer 4, known in itself.

Opposite the compartment 1 is disposed a lower compartment 5, this latter having the shape of a truncated regular four-sided pyramid whose axis extends from the axis of the upper truncated pyramid 2 and that of the compartment 1, the summit or small base 6 directed toward the transducer 4 receives the transducer 7 for shrill tones, the said transducers 4 and 7 are disposed in a coaxial manner with their membranes facing one another, the said compartments 1 and 5 are maintained spaced from one another by means of uprights 8 for example. So as to diffuse in a horizontal and omnidirectional manner a portion of the sounds emitted by the transducers 4 and 7, intermediate between the membranes a diffuser 9 of convex revolution shape of the pear-shaped type is maintained in a manner known in itself in extension of the axes of the transducers 4 and 7, and has an exponential volume of revolution shape 10 directed toward the shrill tone transducer 7 and a parabolic shape 11 directed toward the low/medium tone transducer 4, a portion of the sounds emitted by the transducers 4 and 7 and not diffused by the diffuser 9 being caused to be reflected by the surfaces 12 of a lower compartment 5 for the low and medium tones and by the surfaces 13 of the extension 2 for the shrill tones, the dispersion occurring horizontally over the periphery of the chamber.

According to the variation shown in FIG. 2 and so as to improve the omnidirectional diffusion of sounds not diffused by the diffuser 9, the base of the compartments 1 and 5 has a circular shape, the compartment 1 constituting the tuning volume of the low/medium tone transducer 4 is cylindrical and its extension is a truncated cone 15, the opposite compartment 16 supporting the transducer 7 being itself a truncated cone 17.

It goes without saying that the base of the opposed compartments may have various regular shapes such as equilateral triangular, squared, polygonal, circular, the extensions corresponding to the said bases being truncated regular pyramids or truncated surfaces of revolution.

Without departing from the scope of the invention, the opposed compartments may advantageously have disparate bases, especially a square base for the upper compartment and a circular base for the lower compartment.

I claim:

1. An omnidirectional electro-acoustical chamber comprising a first tone transducer and a second tone transducer, said first tone transducer being disposed coaxially with respect to said second tone transducer, said first tone transducer having a membrane positioned so as to face a membrane of said second tone transducer said first tone transducer being disposed in a first compartment, said second tone transducer being disposed in a second compartment, said first compartment having a general shape of a truncated pyramid having a first end surface and a second end surface, said first end surface of said first compartment having a smaller area than said second end surface of said first compartment, said second compartment having a general shape of a truncated pyramid having a first end surface and a second end surface, said first end surface of said second compartment having a smaller area than said second end surface of said second compartment, said first tone transducer positioned in said first end surface of said first compartment, said second tone transducer positioned in said first end surface of said second compartment, said second end surface of said first compartment positioned opposite said first end surface from said second compartment, said second end surface of said second compartment positioned opposite said first end surface from said first compartment, and a generally pear-shaped diffuser disposed coaxially between said first tone transducer and said second tone transducer, said diffuser having a convex surface of revolution confronting said first tone transducer and a pointed surface of revolution confronting said second tone transducer.

2. An omnidirectional electro-acoustical chamber as claimed in claim 1, in which said first and second compartments are truncated cones.

3. An omnidirectional electro-acoustical chamber as claimed in claim 1, in which said first and second compartments are polygonal.

4. An omnidirectional electro-acoustical chamber as claimed in claim 1, wherein said convex surface of revolution of said diffuser is parabolic and said pointed surface of revolution of said diffuser is conical.

* * * * *